(12) United States Patent
Schulze et al.

(10) Patent No.: US 12,211,703 B2
(45) Date of Patent: *Jan. 28, 2025

(54) METHODS FOR FORMING A SEMICONDUCTOR DEVICE HAVING A SECOND SEMICONDUCTOR LAYER ON A FIRST SEMICONDUCTOR LAYER

(71) Applicant: Infineon Technologies AG, Neubiberg (DE)

(72) Inventors: Hans-Joachim Schulze, Taufkirchen (DE); Alexander Breymesser, Villach (AT); Bernhard Goller, Villach (AT); Matthias Kuenle, Villach (AT); Helmut Oefner, Zorneding (DE); Francisco Javier Santos Rodriguez, Villach (AT); Stephan Voss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/236,434

(22) Filed: Aug. 22, 2023

(65) Prior Publication Data

US 2023/0395394 A1 Dec. 7, 2023

Related U.S. Application Data

(63) Continuation of application No. 17/386,699, filed on Jul. 28, 2021, now Pat. No. 11,742,215.

(30) Foreign Application Priority Data

Jul. 29, 2020 (DE) ......................... 102020119953.8

(51) Int. Cl.
H01L 21/324 (2006.01)
H01L 21/265 (2006.01)
H01L 21/78 (2006.01)

(52) U.S. Cl.
CPC .... H01L 21/3247 (2013.01); H01L 21/26506 (2013.01); H01L 21/7806 (2013.01)

(58) Field of Classification Search
None
See application file for complete search history.

(56) References Cited

U.S. PATENT DOCUMENTS 6,143,629 A 11/2000 Sato
6,180,497 B1 1/2001 Sato et al.
(Continued)

FOREIGN PATENT DOCUMENTS

DE 102019111377 A1 11/2019
FR 3002812 B1 8/2016

OTHER PUBLICATIONS

Solanki, C.S., et al., "Porous silicon layer transfer processes for solar cells", Solar Energy Materials & Solar Cells, vol. 83, 2004, 101-113.

*Primary Examiner* — Erik Kielin
(74) *Attorney, Agent, or Firm* — Murphy, Bilak & Homiller, PLLC

(57) ABSTRACT

A method of forming a semiconductor device includes: forming a first semiconductor layer on a semiconductor substrate, the first semiconductor layer being of the same dopant type as the semiconductor substrate, the first semiconductor layer having a higher dopant concentration than the semiconductor substrate; increasing the porosity of the first semiconductor layer; first annealing the first semiconductor layer in an atmosphere including an inert gas; forming a second semiconductor layer on the first semiconductor layer; and separating the second semiconductor layer from (Continued)

the semiconductor substrate by splitting within the first semiconductor layer. Additional methods of forming a semiconductor device are described.

19 Claims, 10 Drawing Sheets

(56) References Cited

U.S. PATENT DOCUMENTS

| | | |
|---|---|---|
| 6,326,279 B1 | 12/2001 | Kakizaki et al. |
| 6,375,738 B1 | 4/2002 | Sato |
| 6,468,923 B1 | 10/2002 | Yonehara et al. |
| 11,742,215 B2 * | 8/2023 | Schulze ............... H01L 21/306 |
| | | 438/795 |
| 2016/0268123 A1 | 9/2016 | De Souza et al. |
| 2018/0082898 A1 | 3/2018 | Schulze et al. |
| 2019/0043956 A1 | 2/2019 | De Souza et al. |
| 2019/0074212 A1 * | 3/2019 | Muri ................. H01L 21/02532 |

* cited by examiner

METHODS FOR FORMING A SEMICONDUCTOR DEVICE HAVING A SECOND SEMICONDUCTOR LAYER ON A FIRST SEMICONDUCTOR LAYER

TECHNICAL FIELD

Examples relate to concepts for improved splitting of semiconductor substrates and particular to a method for forming a semiconductor device.

BACKGROUND

The separation of semiconductor devices from substrate may be performed by using a separation layer formed between semiconductor device and substrate. The separation layer can be made of a porous Si layer and is formed on the surface of the substrate. Then an active Si layer is epitaxially grown on the porous Si layer. An accurate control of a thickness of the separation layer and/or of the thermal diffusion process may be desired.

SUMMARY

There may be a demand to provide an improved concept for forming a semiconductor device, which allows an improved dopant distribution.

Such a demand may be satisfied by the subject matter of the claims.

Embodiments relate to a method for forming a semiconductor device. The method comprises forming a first semiconductor layer on a semiconductor substrate. The first semiconductor layer is of the same dopant type as the semiconductor substrate. The first semiconductor layer has a higher dopant concentration than the semiconductor substrate. Further, the method comprises increasing the porosity of the first semiconductor layer and first annealing the first semiconductor layer at a temperature of at least 1050° C. Additionally, the method comprises forming a second semiconductor layer on the first semiconductor layer and separating the second semiconductor layer from the semiconductor substrate by splitting within the first semiconductor layer.

Further embodiments relate to a method of forming a semiconductor device. The method comprises forming a first semiconductor layer on a semiconductor substrate. The first semiconductor layer is of the same dopant type as the semiconductor substrate. The first semiconductor layer has a higher dopant concentration than the semiconductor substrate. Further, the method comprises increasing the porosity of the first semiconductor layer, first annealing the first semiconductor in an atmosphere including at least one material from the group nitrogen and argon. Additionally, the method comprises forming a second semiconductor layer on the first semiconductor layer and separating the second semiconductor layer from the semiconductor substrate by splitting within the first semiconductor layer.

Some embodiments relate to a method of forming a semiconductor device. The method comprises forming a first semiconductor layer on a semiconductor substrate. The first semiconductor layer is of the same dopant type as the semiconductor substrate. The first semiconductor layer has a higher dopant concentration than the semiconductor substrate. Further, the method comprises increasing the porosity of the first semiconductor layer, decreasing the dopant concentration of the first semiconductor layer so that the dopant concentration of the first semiconductor layer is $5*10^{16}$ cm$^{-3}$ or less. Additionally, the method comprises forming a second semiconductor layer on the first semiconductor layer and separating the second semiconductor layer from the semiconductor substrate by splitting within the first semiconductor layer.

Other embodiments relate to a method of forming a semiconductor device. The method comprises forming a first semiconductor layer on a semiconductor substrate. The first semiconductor layer is of the same dopant type as the semiconductor substrate. The first semiconductor layer has a higher dopant concentration than the semiconductor substrate. Further, the method comprises increasing the porosity of the first semiconductor layer, decreasing the dopant concentration of the first semiconductor layer by at least 15%. Additionally, the method comprises forming a second semiconductor layer on the first semiconductor layer and separating the second semiconductor layer from the semiconductor substrate by splitting within the first semiconductor layer.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of the group A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
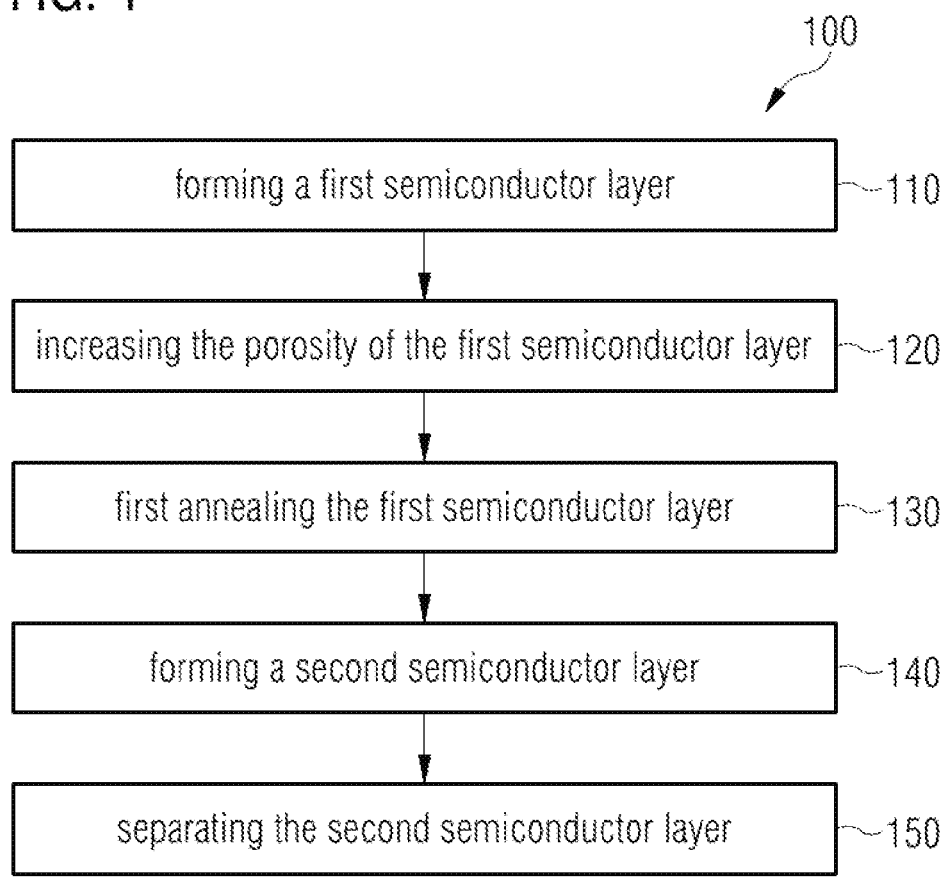
FIG. 1 shows a flow chart of a method for forming a semiconductor device.

FIG. 1 shows a flow chart of a method for forming a semiconductor. The method 100 comprises forming 110 a first semiconductor layer on a semiconductor substrate. The first semiconductor layer is of the same dopant type as the semiconductor substrate. The first semiconductor layer has a higher dopant concentration than the semiconductor substrate and increasing 120 the porosity of the first semiconductor layer. Further, the method 100 comprises first annealing 130 the first semiconductor layer at a temperature of at least 1050° C. Additionally, the method 100 comprises forming 140 a second semiconductor layer on the first semiconductor layer and separating 150 the second semiconductor layer from the semiconductor substrate by splitting within the first semiconductor layer.

According to an aspect a lowly doped semiconductor substrate may be used. By forming a higher doped first semiconductor layer on the lower doped semiconductor substrate a dopant distribution of the semiconductor device may be improved. The dopant concentration available for a diffusion (e.g. a diffusion during the forming 140 of the second semiconductor layer and/or follow-up processes) into the semiconductor device may be reduced in comparison to the usage of a completely highly doped semiconductor substrate. The dopant distribution of the semiconductor device may be improved by a decreased dopant diffusion into the semiconductor device. The thickness of the first semiconductor layer may be kept low in comparison to a thickness of the semiconductor substrate so that the amount of dopants for diffusion may be kept low.

The method 100 may further include forming the first semiconductor layer on the semiconductor substrate by providing a semiconductor substrate and doping an upper portion of the semiconductor substrate. In other words, the first semiconductor layer may be formed 110 in a surface region of the semiconductor.

The first semiconductor layer formed 110 on or in the surface region of the semiconductor substrate has a higher dopant concentration than the semiconductor substrate. For example, the dopant concentration of the first semiconductor layer may be at most $2*10^{19}$ cm$^{-3}$ (or at most $5*10^{18}$ cm$^{-3}$, or at least sufficient for increasing the porosity) and/or at least $6*10^{17}$ cm$^{-3}$ (or at least $1*10^{18}$ cm$^{-3}$ or at least $2*10^{18}$ cm$^{-3}$).

Figure 5:
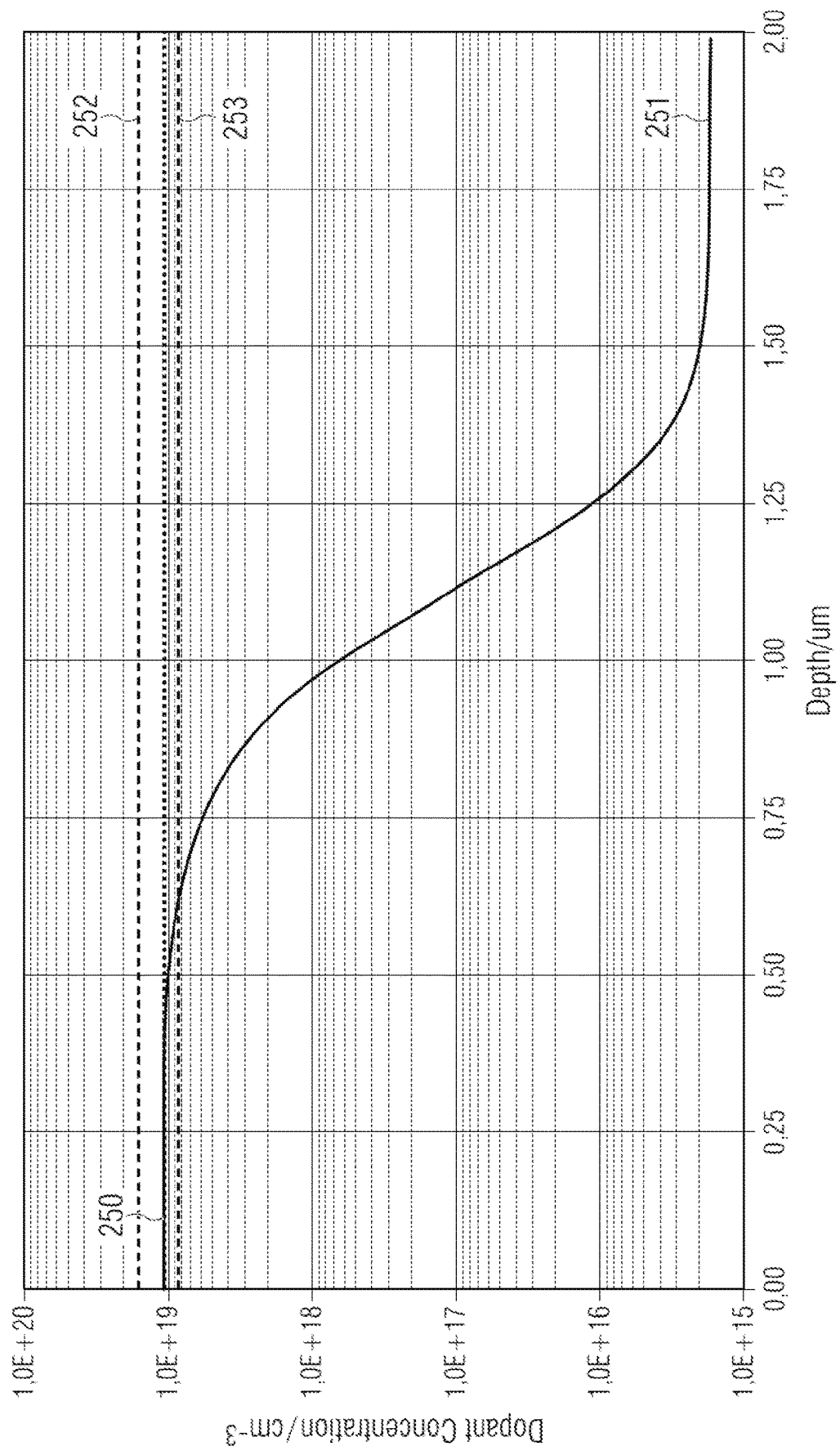
FIG. 5 shows a simulated diagram of the dopant concentration of the first semiconductor layer as a function of the depth.
Figure 6:
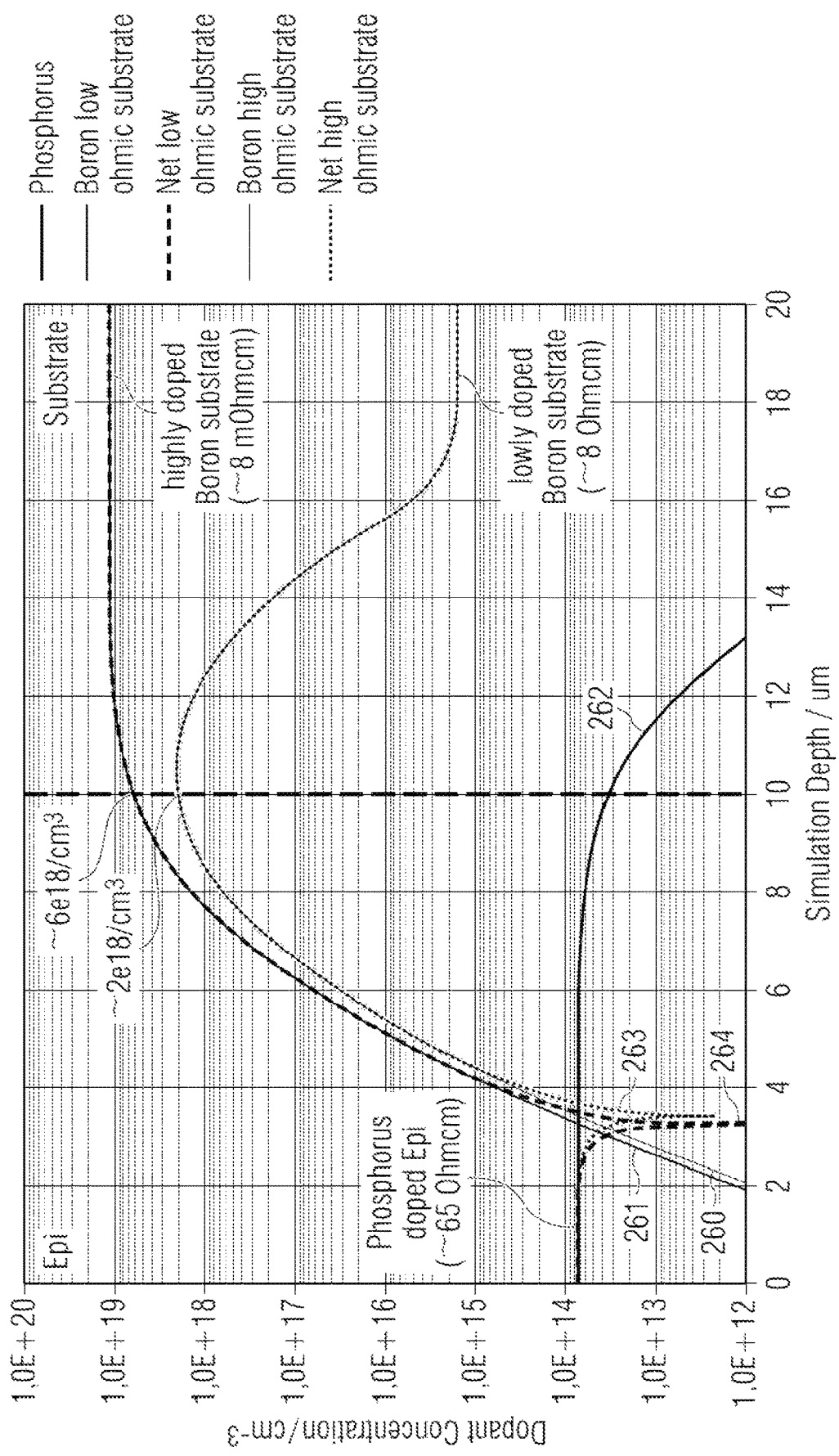
FIG. 6 is a simulated graph of the dopant concentration as a function of the depth, that illustrates the forming of an n-doped second semiconductor layer on a highly p-doped first semiconductor layer on a lowly p-doped semiconductor substrate.

The dopant concentration of the semiconductor substrate may be at most $6*10^{17}$ cm$^{-3}$ (or at most $6*10^{16}$ cm$^{-3}$, at most $6*10^{15}$ cm$^{-3}$ or at most $2*10^{15}$ cm$^{-3}$, for example as shown in FIG. 5 and FIG. 6). A specific resistivity of the semiconductor substrate may be at least 1 Ohmcm (or at least 0.1 Ohmcm or at least 5 Ohmcm) and/or at most 10 Ohmcm (or at most 5 Ohmcm or at most 300 Ohmcm). The measured specific resistivity may depend on the measurement technique, e.g. on a used potentiostat.

The first semiconductor layer may comprise a vertical extension or thickness of at least 300 nm (or at least 1 μm or at least 2 μm) and/or at most 5 μm (or at most 4 μm or at most 3 μm). Thus, the first semiconductor layer may be an exhaustible source for diffusion, so that the dopants may be limited to a fixed amount. The fixed amount can be chosen by the parameters of the first semiconductor layer, e.g. dopant concentration and/or thickness. Furthermore, a dopant diffusion may occur from the first semiconductor layer into the formed 140 second semiconductor layer, as well as into the semiconductor substrate, so that a dopant diffusion into the formed 140 second semiconductor layer may be decreased and/or a dopant distribution may be improved.

Optionally, the semiconductor substrate may be thermal oxidized, e.g. by a dry oxidation, at a temperature of at least 700° C., or at least 900° C. for at least 30 min, before the first semiconductor layer is formed 110 on the semiconductor substrate, to form a scattering oxide layer on and/or to clean the surface of the semiconductor substrate. This scattering oxide layer may comprise a vertical extension or thickness of at least 10 nm, or at least 20 nm, and/or less or 30 nm or less.

The first semiconductor layer may be formed 110 directly on the semiconductor substrate. The first semiconductor layer may be deposited by epitaxial growth (e.g. by chemical vapor deposition) of a highly doped layer on the surface of the lightly doped semiconductor substrate or may be thermally grown on the surface of the semiconductor substrate, so that the first semiconductor layer may be in contact with the semiconductor substrate. Consequently, there may be no removal of material of the semiconductor substrate during separating 150. Thus, the semiconductor substrate may be used any number of times for the method 100, because no part of the semiconductor substrate may be altered to a porous part by increasing 120 the porosity. Furthermore, the doping of the first semiconductor layer and the dopant diffusion into the formed 140 second semiconductor layer may be more precisely controlled by increased reproducible quality of the thickness, increasing 120 the porosity and/or the dopant concentration of the first semiconductor layer. For example, a p-doped layer (e.g. a back side p-type collector (also rear emitter) of an IGBT) may be formed at the back side of the semiconductor device by diffusion of dopants from the first semiconductor layer into the second semiconductor layer.

Alternatively, the first semiconductor layer may be formed 110 by incorporating dopants into the surface region of the semiconductor substrate, for example by ion implantation and/or by diffusion and/or during forming the semiconductor substrate (e.g. during crystal growth). The implantation energy and/or the implantation dose may be chosen to ensure an effective porosification process. For example, the thickness of the first semiconductor layer may be controlled by selecting the implantation energy for the implantation of the dopants, so that thickness of the first semiconductor layer may be determined by the end-of-range of the implantation of the dopant atoms. For example, the dopants may be implanted with a first implant dose of at least $1.5*10^{14}$ cm$^{-2}$ (or at least $1*10^{12}$ cm$^{-2}$ or at least $1*10^{13}$ cm$^{-2}$) and/or at most $5*10^{12}$ cm$^{-2}$ (or at most $5*10^{13}$ cm$^{-2}$ or at most $5*10^{14}$ cm$^{-2}$. The dopants may be implanted with an implantation energy of at least 10 keV (or at least 30 keV) and at most 80 keV (or at most 200 keV). For example, the dopants may be implanted with a second implant dose of at least $4*10^{14}$ cm$^{-2}$ (or at least $1*10^{13}$ cm$^{-2}$ or at least 13 cm$^{-2}$) and/or at most $9*10^{12}$ cm$^{-2}$ (or at most $8*10^{13}$ cm$^{-2}$ or at most $7*10^{14}$ cm$^{-2}$. The dopants may be implanted with an implantation energy of at least 100 keV (or at least 150 keV) and/or at most 180 keV (or at most 200 keV). The dopants may be implanted by consecutive processes comprising a first process with the first implant dose and a second process with the second implant dose.

Optionally, the first semiconductor layer may be subjected to a heat treatment at a temperature of at least 800° C. or at least 1000° C. for at least 60 min or at least 120 min for recovery (cure lattice damage caused by ion implantation) and/or activation (activate the implanted dopants) and/or forming the dopant profile by dopant diffusion. The heat treatment may be performed by heating in an oven and/or by a laser heating. The activation of the implanted dopants may improve increasing 120 the porosity. The forming of the dopant profile may improve increasing 120 the porosity. A depth of penetration of the dopants into the first semiconductor layer may depend e.g. on the time of the heat treatment, so that increasing 120 the porosity may be only performed until a distance from the surface of the first semiconductor layer corresponding to the depth of penetration. Thus, a thickness of a porous layer formed by the increasing 120 of the porosity may be defined by the depth of penetration of the dopants. Consequently, the dopant profile may be used for an improved control of increasing 120 of the porosity of the first semiconductor layer, so that increasing 120 the porosity may be controlled by an electric current density of a porosification process, as well as by the dopant profile. In particular, by those measures the lateral homogeneity of the vertical extension of the porous layer may be improved. Thus, a morphology of pores may be formed according to the dopant concentration. For example a homogeneous dopant profile with a thickness of at least 0.3 μm (or at least 0.4 μm or at least or at least 0.8 μm) and a dopant concentration of at least $5*10^{17}$ cm$^{-3}$ (or at least $3*10^{18}$ cm$^{-3}$ or at least $1.5*10^{19}$ cm$^{-3}$) may be formed into the surface of the semiconductor substrate (see also FIG. 5). Thus, a thickness of a porous layer formed by increasing 120 the porosity may be defined by a thickness of the highly doped first semiconductor layer. This maybe also referred to as self adjusting porosification. As a further example, the dopant profile may be a retrograde profile, which may be defined by an ion implantation energy and/or by dopant diffusion, or by special melting laser treatments using e.g. multiple laser shots, so that increasing 120 the porosity may be more efficient in a region with a certain distance to a surface of the first semiconductor layer. Furthermore, increasing 120 the porosity may be limited to a part of the first semiconductor layer, because of the steep descent of the retrograde profile, so that a porosification process may stop in a predefined distance to the surface of the first semiconductor layer (e.g. self adjusting porosification).

Optionally, after the heat treatment an oxide layer on the surface of the first semiconductor (e.g. caused by previous process steps) may be removed by etching and/or polishing e. b. by a chemical-mechanical polishing process.

The first semiconductor layer may cover the whole surface of the semiconductor substrate. Alternatively, the first semiconductor layer may be patterned, e.g. by photolithography. A pattern of the first semiconductor layer may be formed by covering a first region, e.g. an edge of the semiconductor substrate, by a mask material (e.g. photoresist) before the first semiconductor layer is formed 110 on the semiconductor substrate. The first semiconductor layer may be grown, deposited or implanted only at a target region uncovered by the mask material, e.g. a center region. So, increasing 120 the porosity may be limited to the target region. For example, a porous material formed by increasing 120 the porosity may be formed as an island on the semiconductor substrate. The mask material at the first region (e.g. an edge of the semiconductor substrate) may block the ion penetration, so that the first semiconductor layer may be only formed at the second region, e.g. a center region.

Optionally, the first region covered by a material may enclose the second region during forming 110 the first semiconductor layer. Thus, a porous material formed by increasing 120 the porosity may be laterally surrounded by non-porous material of the lightly doped semiconductor substrate along an edge of the lightly doped semiconductor substrate. So, increasing 120 the porosity with a laterally surrounding of non-porous material may be defined by the implantation of ions during forming 110 the first semiconductor layer. Therefore, a use of a sealing ring on a surface of the wafer carrier for patterning porous parts of the first semiconductor layer may be replaced by the ion implantation and the mask material.

Increasing 120 the porosity of the first semiconductor layer may be done by a porosification process altering the crystal structure of the first semiconductor layer from e.g. a single- or multi-crystalline structure into a porous structure. Increasing 120 the porosity of the first semiconductor may lead to a decrease of the dopant concentration of the first semiconductor layer due to removal of material, so that a dopant diffusion caused by e.g. forming the second semiconductor layer may be reduced. The porosity may be a fraction of the volume of voids over the total volume. The porosification process may lead to an increase of the volume of voids, so the porosity of the first semiconductor layer is increased and a surface concentration and a volume concentration is decreased. The porosity/surface concentration may be increased/decreased by at least 30%, or by at least 50%, or by at least 70% by the porosification process (see also FIG. 7). For example, the dopant concentration of the first semiconductor layer may be decreased from $2*10^{18}$ cm$^{-3}$ to at most $1.4*10^{18}$ cm$^{-3}$ (or to at most $1*10^{18}$ cm$^{-3}$ or to at most $6*10^{17}$ cm$^{-3}$). The porous layer formed by the porosification process may include a plurality of cavities such as mesopores and/or nanopores and/or macropores. Typical pore sizes for nanopores may be at most 2 nm, for mesopores at least 2 nm and at most 100 nm and macropores can have pore sizes in the μm range.

A thickness of the porous layer may depend on the dopant concentration and the vertical dopant distribution, a used solution (e.g. a solution containing a hydrofluoric acid) and/or on the electrical current density. For example, the porosification process may need a minimum dopant concentration, e.g. $10^{14}$ cm$^{-3}$, or $10^{15}$ cm$^{-3}$ or $10^{16}$ cm$^{-3}$ or even $10^{17}$ cm$^{-3}$ to be performed. Optionally, the thickness of the porous layer may be limited by the thickness of the first semiconductor layer. The dopant concentration of the semiconductor substrate may be below the minimum dopant concentration for the porosification process, so that a porosification process in the semiconductor substrate may be substantially prevented. Consequently, the thickness of the porous layer may be less than or equal to the thickness of the formed 110 first semiconductor layer. For forming 110 the first semiconductor layer on the semiconductor substrate, the semiconductor substrate may not be substantially affected by the porosification process. Thus, the semiconductor substrate may be used any number of times for the method 100. For forming 110 the first semiconductor layer into the substrate layer, the dopant profile (e.g. a retrograde profile) may determine the thickness of the porous layer.

Optionally, the first semiconductor layer or the porous layer may be defined by ion implantation after the porosification process, so a functionality of the first semiconductor layer after separating 150 may be improved. A remaining part of the first semiconductor layer after separating 150 may be used as back side of the semiconductor device. For example, a p-doping of the first semiconductor layer or the porous layer may be reduced or compensated by the ion implantation of donors after the porosification process. Consequently, the functionality of the (remaining part of) first semiconductor layer as a collector (e.g. rear emitter) may be reduced or prevented. Furthermore, a position of a formed p-n junction between the semiconductor substrate and the second semiconductor layer may be defined by ion implantation of dopants into the first semiconductor layer. For example, a p-type first semiconductor layer may be transformed to an n-type first semiconductor layer by the ion implantation of donors, so that the position of the p-n junction between (e.g. an n-type second semiconductor layer and a p-type semiconductor substrate) may be moved towards or into the semiconductor substrate. Additionally, the ion implantation after the porosification process may be used to form a field stop layer during the forming 140 of the second semiconductor layer and/or during further heat treatments. For example, an n-type doping of the first semiconductor layer by the ion implantation of donors may improve a forming of the field stop layer during the forming 140 by diffusion of the donors.

Optionally, the porous layer may be formed by a multi-layer, e.g. by a first porous layer formed in contact with the semiconductor substrate and a second porous layer formed on the first porous layer without contact to the semiconductor substrate. The first porous layer and the second porous layer may have a different lattice constant and/or pore size (also void size). For example, the pore size of the second porous layer may be kept small enough, so that an appropriate forming 140 of the second semiconductor layer may be allowed. The pore size of the first porous layer may be increased in comparison to the second porous layer, so that a separation 150 along the first porous layer may be improved. The multi-layer may be formed by two successive different porosification processes, e.g. by using a different electric current density.

First annealing 130 of the first semiconductor layer is done at a temperature of at least 1050° C. By the first annealing 130 the dopant concentration in the first semiconductor layer may be decreased by dopant diffusion into the semiconductor substrate and/or out diffusion. Because of the greatly increased surface-to-volume ratio of porous materials in comparison to non-porous materials, the dopant diffusion may be performed at lower temperature and/or shorter timescale as for a non-porous material. The method 100 may further comprise performing the first annealing 130 at a temperature of 1300° C. or less. The first annealing 130 may be done at a temperature of at least 1100° C. (or at least 1150° C.) and/or at a temperature of at most 1400° C. (or at most 1300° C. or at most 1200° C.) and/or for at least min (or at least 120 min or at least 180 min) and/or for at most 300 min (or for at most 240 min). The method 100 may comprise first annealing the first semiconductor layer in an atmosphere including an inert gas, e.g. at least one material or gas from the group nitrogen and argon. Thus, an oxidation of surfaces of pores of the first semiconductor layer surface may be reduced or prevented.

The method 100 may further comprise performing the first annealing 130 in an atmosphere including an inert gas, e.g. argon, but lacking nitrogen. The atmosphere including argon but lacking nitrogen may reduce chemical reaction at the surface/inside the first semiconductor layer during the first annealing 130, e.g. may reduce an oxidation of surfaces of the pores of the first semiconductor layer. For example, the dopant diffusion during the first annealing 130 may be less decreased by an oxide layer on the surfaces of the pores of the first semiconductor layer.

Furthermore, an oxide layer may be formed by the first annealing 130 at an interface of the porous layer and the first semiconductor layer or semiconductor substrate. This oxide layer may decrease a dopant diffusion into the second semiconductor layer by absorbing dopants, so that the dopant concentration for diffusion during forming 140 the second semiconductor layer and/or follow-up processes may be reduced. Optionally, the first annealing 130 may be performed during normal manufacturing process of a semiconductor device, e.g. during a process of substrate treating/preparation for forming the second semiconductor layer.

Optionally, the dopant diffusion may be reduced by oxidizing at least a part of the surfaces of the pores of the first semiconductor layer and/or the interface of the porous layer and the first semiconductor layer or semiconductor substrate, e.g. by electrochemical anodic oxidation. In this case, the dopant diffusion into the second semiconductor layer may be decreased by absorbing dopants in the oxides, so that the dopant concentration for diffusion during forming 140 the second semiconductor layer and/or follow-up processes may be reduced. Additionally, the surface of the first semiconductor layer may be defined by etching and/or polishing, e.g. after the oxidation of the part of the surfaces of the pores by a chemical-mechanical polishing process. This may improve an epitaxial growth of the second semiconductor layer on the surface of the first semiconductor layer.

Figure 8:
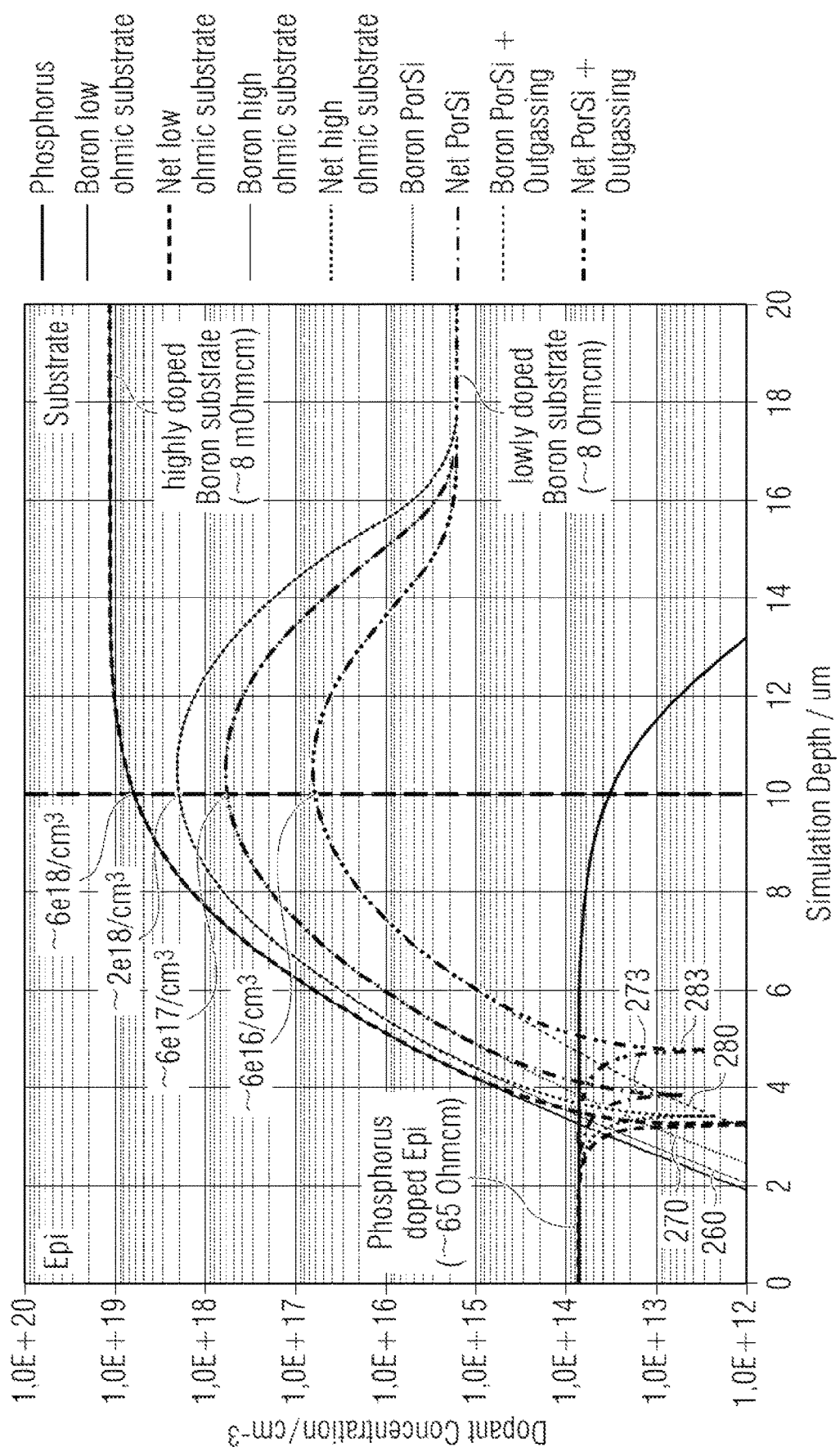
FIG. 8 is a simulated graph that illustrates the processing of FIG. 7 and an effect of an annealing of the first semiconductor layer.

The dopant concentration of the first semiconductor layer may be reduced by the first annealing 130 by dopant diffusion by at least 30% or by at least 50% or by at least 90% (see also FIG. 8). For example, the dopant concentration of the first semiconductor layer may be decreased from $6*10^{17}$ cm$^{-3}$ to at most $4.2*10^{17}$ cm$^{-3}$ (or to at most $3*10^{17}$ cm$^{-3}$ or to at most $6*10^{16}$ cm$^{-3}$).

The method 100 may further comprise decreasing the dopant concentration of the first semiconductor layer so that the dopant concentration of the first semiconductor layer is $5*10^{16}$ cm$^{-3}$ or less. The method 100 may further comprise decreasing the dopant concentration of the first semiconductor layer by at least 15% or at least 30% or at least 50% or even at least 80% in comparison to the dopant concentration of the first semiconductor layer after increasing 120 the porosity.

The method 100 may further comprise smoothing the surface of the first semiconductor layer before forming the second semiconductor layer. The second semiconductor layer is formed on the smoothed surface of the first semiconductor layer. The smoothing may be performed by pore reorganization. The pore reorganization of the first semiconductor layer may comprise pore reorganization of at least a part of the surface of the first semiconductor layer in an ambient atmosphere of hydrogen at a temperature of at least 1050° C. for at least 15 min Thus, forming 140 the second semiconductor layer may be improved, for example by reducing the total amount of void space accessible from the surface, e.g. by generating a foam structure of the pores on the surface and/or into the porous layer.

Additionally, the method 100 may further comprise smoothing after decreasing the dopant concentration of the first semiconductor layer. Alternatively, the method 100 may further comprise smoothing at the same time as decreasing the dopant concentration of the first semiconductor layer, so that a time saving may be achieved.

The method 100 may further comprise a second annealing in an atmosphere of hydrogen, the second annealing performed after the first annealing but before forming 140 the second semiconductor layer. The second annealing may be used for annealing and/or diffusing the first semiconductor layer implantation before porosification. The method 100 may further comprise performing the second annealing at a temperature of 1000° C. or less. The method 100 may comprise performing the second annealing at a temperature of at least 700° C. (or at least at 800° C.) and/or at a temperature of at most 1100° C. (or at most 1000° C. or at most 900° C.) and/or for at least 15 min and/or for at most 300 min.

The second semiconductor layer is formed 140 on the first semiconductor layer. The first semiconductor layer and/or second semiconductor layer may be an epitaxial layer. The dopant type of the first semiconductor layer and the semiconductor substrate may be p-type, e.g. boron doped, and of the second semiconductor layer may be an n-type, e.g. phosphorus doped. The semiconductor substrate may be a silicon wafer and the first semiconductor layer may be a silicon layer.

After the finalization of the frontside processes such as e.g. body/source/gate/metallization realization, the second semiconductor layer is separated 150 from the semiconductor substrate by splitting within the first semiconductor layer, e.g. by splitting along the porous layer. A remaining part of the first semiconductor layer after splitting may be used as back side of the semiconductor device. The splitting of the first semiconductor layer may be performed by mechanical stress (e.g. by cooling), thermomechanical stress, pressure applied to the buried cavities, etching of pillars connecting the semiconductor substrate to the second semiconductor layer. The splitting may be improved by a large porosity. Alternatively, the back side of the semiconductor device may be formed by a surface of the second semiconductor layer adjacent to the first semiconductor layer by removing the first semiconductor layer completely by the splitting or by an etching and/or polishing process after splitting. Additionally, a dopant profile of the back side of the semiconductor device may be defined by an etching and/or polishing process, so that a functionality as e.g. collector or field stop layer may be improved or an undesirable dopant concentration (e.g. caused by diffusion during the forming 140 of the second semiconductor layer) may be removed. Furthermore, the reducing of the dopant concentration in the first semiconductor layer according to the method 100 could be particularly beneficial for forming the back side of the semiconductor device. An undesired dopant diffusion into the back side of the semiconductor device using method 100 may be reduced due to the lower dopant concentration of the first semiconductor layer, so that a dopant diffusion into the back side of the semiconductor device may be below a dopant concentration needed for forming a field stop zone, e.g. at most $6*10^{16}$ cm$^{-3}$ (or at most $3*10^{16}$ cm$^{-3}$ or at most $1*10^{16}$ cm$^{-3}$). Therefore, the dopant diffusion from the first semiconductor layer into the second semiconductor layer may have no influence on forming the field stop zone inside the back side of the semiconductor device. Thereby, an undesired forming of a zone, doped oppositely to a drift zone, may be reduced or prevented.

The method 100 may further comprise forming a back side metallization at a surface of the back side of the semiconductor device. The method 100 may further comprise forming an electrical element of the semiconductor device on the second semiconductor layer before separating 150 the second semiconductor layer from the semiconductor substrate. The electrical element may be a source region, a gate structure, a drain region, a collector region, an emitter region or a field stop zone region of a transistor. Furthermore, the semiconductor device manufactured according to method 100 may be a vertical power device.

The semiconductor substrate may comprise a thickness of at least 50 μm (or at least 100 μm or at least 200 μm) and/or at most 1 mm (or at most 800 μm or at most 500 μm or at most 200 μm). The semiconductor substrate may be a semiconductor wafer or a semiconductor die. For example, the semiconductor substrate may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate.

For example, a vertical direction and a vertical dimension or thicknesses of layers may be measured orthogonal to a front side surface of the semiconductor substrate and a lateral direction and lateral dimensions may be measured in parallel to the front side surface of the semiconductor substrate.

A doping region comprising the first conductivity type or dopant type may be a p-doped region (e.g. caused by incorporating aluminum ions or boron ions) or an n-doped region (e.g. caused by incorporating nitrogen ions, phosphorous ions or arsenic ions). Consequently, the second conductivity type or dopant type indicates an opposite n-doped region or p-doped region. In other words, the first conductivity type or dopant type may indicate a p-doping and the second conductivity type or dopant type may indicate an n-doping or vice-versa.

For example, the semiconductor device may be vertical semiconductor device (e.g. a vertical diode, a vertical field effect transistor, a vertical insulated-gate bipolar transistor and/or a vertical reverse conducting insulated-gate bipolar transistor). A vertical semiconductor device may be a device conducting current in a conductive state or an on-state mainly (e.g. at least 70% of a total current through the device) vertically between the front side and the back side. For example, the semiconductor device may be a power semiconductor device. A power semiconductor device or an electrical structure (e.g. transistor structure or diode structure) of the power semiconductor device may have a breakdown voltage or blocking voltage of at least 10V (e.g. a breakdown voltage of 10 V, 20 V or 50V), at least 100 V (e.g. a breakdown voltage of 200 V, 300 V, 400V or 500V) or at least 500 V (e.g. a breakdown voltage of 600 V, 700 V, 800V or 1000V) or at least 1000 V (e.g. a breakdown voltage of 1200 V, 1500 V, 1700V, 2000V, 3300V or 6500V), for example.

Details and aspects mentioned may intend to reduce the dopant diffusion from the porous layer, so that a resulting dopant concentration in the second semiconductor layer is below a dopant concentration needed for forming a field stop zone, e.g. at most $1*10^{16}$ cm$^{-3}$ or even at most $1 \times 10^{15}$ cm$^{-3}$ or even at most $3 \times 10^{14}$ cm$^{-3}$. Therefore, the dopant diffusion from the porous layer into the second semiconductor layer may have no or only little influence on forming the field stop zone inside the back side of the semiconductor device. Thereby, an undesired forming of a zone, doped oppositely to a drift zone, may be reduced or prevented.

More details and aspects are mentioned in connection with the embodiments described below. The example shown in FIG. 1 may comprise one or more optional additional features corresponding to one or more aspects mentioned in connection with the proposed concept or one or more examples described below (e.g. FIG. 2-10).

Figure 2:
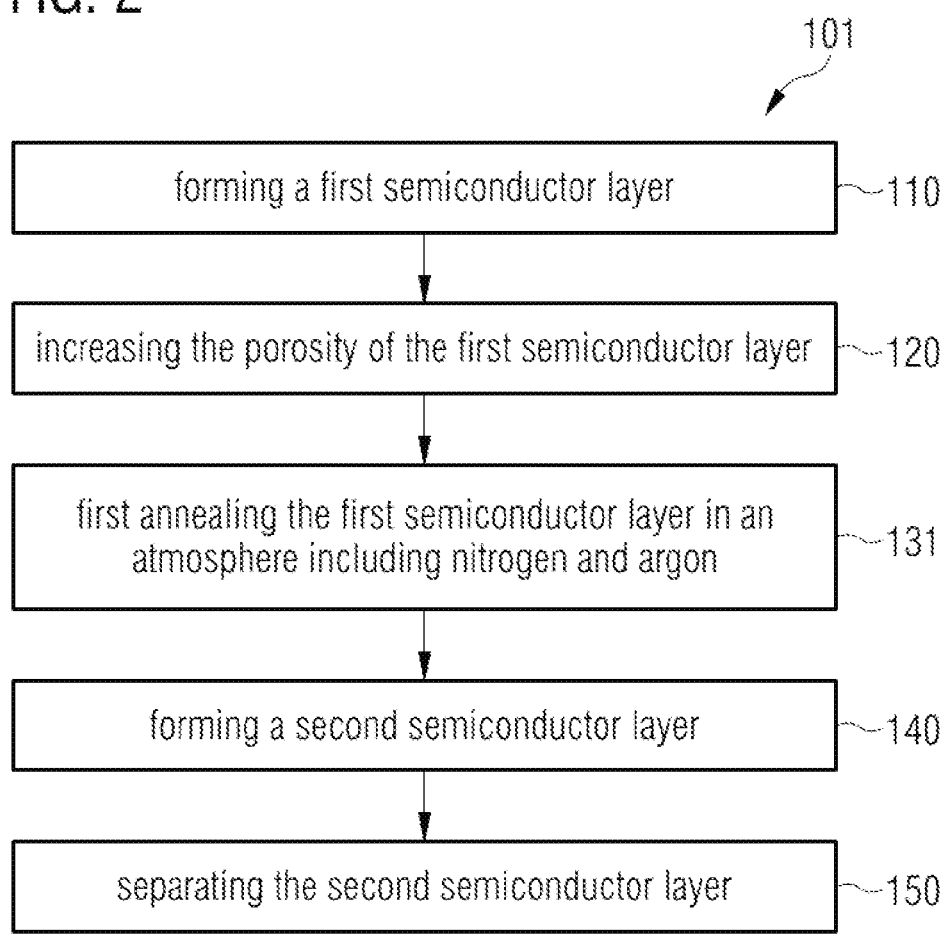
FIG. 2 shows another flow chart of a method for forming a semiconductor.

FIG. 2 shows a flow chart of a method for forming a semiconductor. The method 101 comprises forming 110 a first semiconductor layer on a semiconductor substrate. The first semiconductor layer is of the same dopant type as the semiconductor substrate. The first semiconductor layer has a higher dopant concentration than the semiconductor substrate and increasing 120 the porosity of the first semiconductor layer. Further, the method 101 comprises first annealing 131 the first semiconductor layer in an atmosphere including at least one material from the group nitrogen and argon. Additionally, the method 101 comprises forming 140 a second semiconductor layer on the first semiconductor layer and separating 150 the second semiconductor layer from the semiconductor substrate by splitting within the first semiconductor layer after the finalization of the frontside processes. The first annealing 131 in an atmosphere including at least one material from the group nitrogen and argon may reduce an oxidation of surfaces of pores of the first semiconductor layer.

More details and aspects are mentioned in connection with the embodiments described above or below. The example shown in FIG. 2 may comprise one or more optional additional features corresponding to one or more aspects mentioned in connection with the proposed concept or one or more examples described above (e.g. FIG. 1) or below (e.g. FIG. 3-10).

Figure 3:
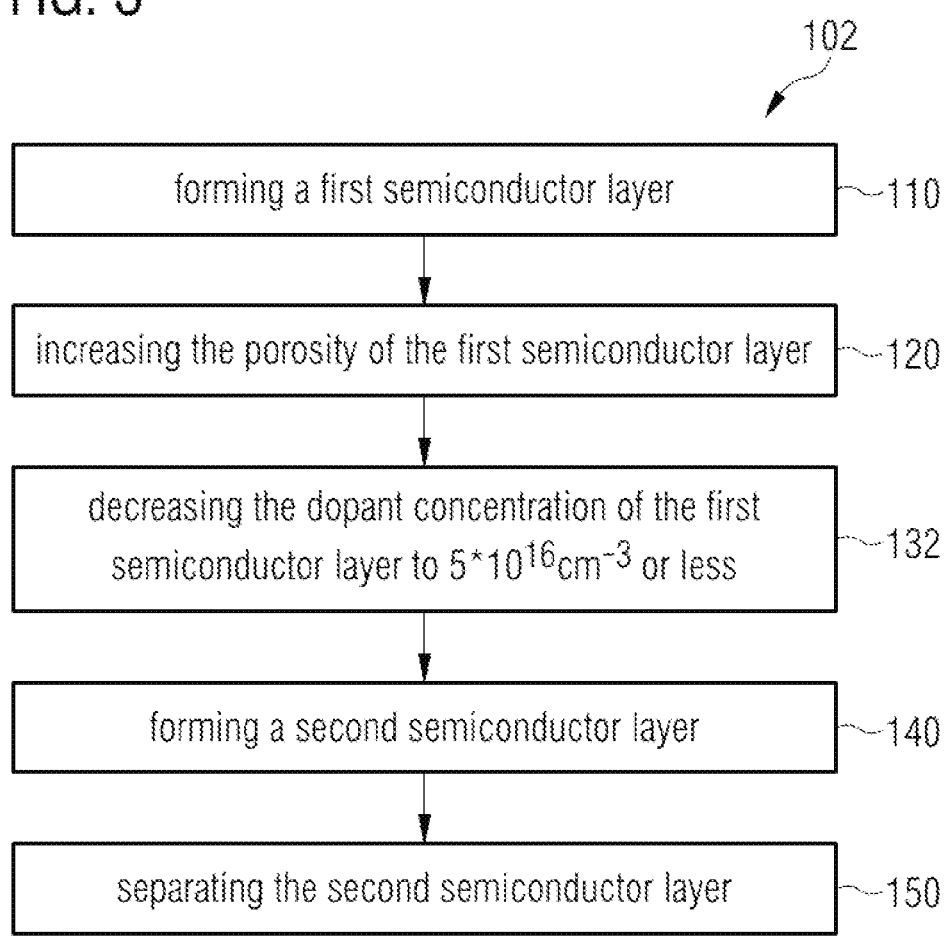
FIG. 3 shows another flow chart of a method for forming a semiconductor device.

FIG. 3 shows a flow chart of a method for forming a semiconductor. The method 102 comprises forming 110 a first semiconductor layer on a semiconductor substrate. The first semiconductor layer is of the same dopant type as the semiconductor substrate. The first semiconductor layer has a higher dopant concentration than the semiconductor substrate and increasing 120 the porosity of the first semiconductor layer. Further, the method 102 comprises decreasing 132 the dopant concentration of the first semiconductor layer so that the dopant concentration of the first semiconductor layer is $5 \times 10^{16}$ cm$^{-3}$ or less. Additionally, the method 102 comprises forming 140 a second semiconductor layer on the first semiconductor layer and separating 150 the second semiconductor layer from the semiconductor substrate after the finalization of the frontside processes by splitting within the first semiconductor layer. The decreasing 132 can be performed by heating.

More details and aspects are mentioned in connection with the embodiments described above or below. The example shown in FIG. 3 may comprise one or more optional additional features corresponding to one or more aspects mentioned in connection with the proposed concept or one or more examples described above (e.g. FIG. 1, 2) or below (e.g. FIG. 4-10).

Figure 4:
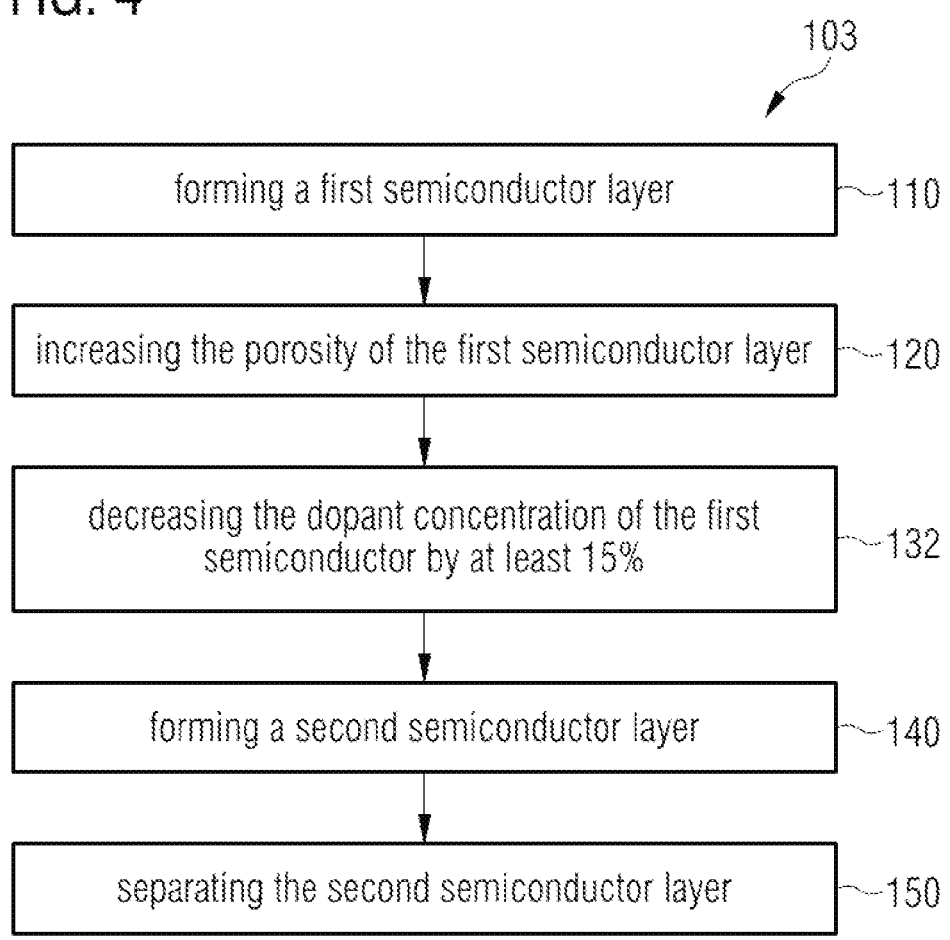
FIG. 4 shows another flow chart of a method for forming a semiconductor device.

FIG. 4 shows a flow chart of a method for forming a semiconductor. The method 103 comprises forming 110 a first semiconductor layer on a semiconductor substrate. The first semiconductor layer is of the same dopant type as the semiconductor substrate. The first semiconductor layer has a higher dopant concentration than the semiconductor substrate and increasing 120 the porosity of the first semiconductor layer. Further, the method 103 comprises decreasing 133 the dopant concentration of the first semiconductor layer by at least 15% or by at least 50%. Additionally, the method 103 comprises forming 140 a second semiconductor layer on the first semiconductor layer and separating 150 the second semiconductor layer from the semiconductor substrate by splitting within the first semiconductor layer after the finalization of the frontside processes. The decreasing 133 can be performed by heating.

More details and aspects are mentioned in connection with the embodiments described above or below. The example shown in FIG. 4 may comprise one or more optional additional features corresponding to one or more aspects mentioned in connection with the proposed concept or one or more examples described above (e.g. FIG. 1-3) or below (e.g. FIG. 5-10).

FIG. 5 shows a simulated diagram of the dopant concentration of the first semiconductor layer as a function of the depth. A highly doped first semiconductor layer 250 is formed on a lowly doped semiconductor substrate 251 by ion implantation. The first semiconductor layer 250 has a nearly homogeneous doping profile from the surface of the semiconductor substrate at the position x=0 μm down to a position in the semiconductor at a distance of about 0.5 μm to the surface with a dopant concentration of $1.1*10^{19}$ cm$^{-3}$ (resistivity is approximately 8 mOhmcm) and down to a position in the semiconductor at a distance of about 0.635 μm to the surface with a dopant concentration of $8.8*10^{18}$ cm$^{-3}$ (resistivity is approximately 10 mOhmcm). The dashed lines 252 and 253 indicate a typical range for a highly doped semiconductor substrate used for porosification processes.

More details and aspects are mentioned in connection with the embodiments described above or below. The example shown in FIG. 5 may comprise one or more optional additional features corresponding to one or more aspects mentioned in connection with the proposed concept or one or more examples described above (e.g. FIG. 1-4) or below (e.g. FIG. 6-10).

FIG. 6 is a simulated graph of the dopant concentration as a function of the depth, that illustrates the forming of an n-doped second semiconductor layer on a highly p-doped semiconductor substrate or on a highly p-doped first semiconductor layer on a lowly p-doped semiconductor substrate. The lines 260 and 261 show the acceptor concentration inside the first/second semiconductor layer and the semiconductor substrate for the highly p-doped first semiconductor layer on the lowly p-doped semiconductor substrate or for the highly p-doped semiconductor substrate, respectively. The second semiconductor layer may be formed by epitaxial growth of an n-type material. Line 262 shows the donor concentration caused by the epitaxial grown of the second semiconductor layer. The dashed lines 263 and 264 show the net doping concentration inside the first/second semiconductor layer and the semiconductor substrate the highly p-doped first semiconductor layer on the lowly p-doped semiconductor substrate or for the highly p-doped semiconductor substrate, respectively. The dopant concentration is identical for both dashed lines 263 and 264 at the surface (front side) of the second semiconductor layer at a position of x=0 μm and differs at the back side of the second semiconductor layer. The dopant concentration at the back side of the second semiconductor layer is dominated by acceptors from the first semiconductor layer 260 or the highly p-doped semiconductor substrate 261, respectively. Thus, the dopant concentration may be beneficial reduced by an exhaustible source for diffusion of the first semiconductor layer 260 in comparison to the inexhaustible source of the highly p-doped semiconductor substrate 261 and a dopant distribution may be improved. Furthermore, a p-n-junction is shifted towards the semiconductor substrate for forming the second semiconductor layer on the first semiconductor layer 263 in comparison to the highly p-doped semiconductor substrate 261 and a dopant distribution may be improved. The epitaxially grown second semiconductor layer is n-doped with e.g. a phosphorus concentration of at most $2*10^{14}$ cm$^{-3}$ (or at most $8*10^{13}$ cm$^{-3}$ or at most $4*10^{13}$ cm$^{-3}$) and/or at least $1*10^{13}$ cm$^{-3}$ (or at least $2*10^{13}$ cm$^{-3}$), the first semiconductor layer may be p-doped with a dopant concentration of at most $8*10^{18}$ cm$^{-3}$. After formation of the second silicon layer, the lowly p-doped semiconductor substrate may be doped with a dopant concentration of at most $2*10^{15}$ cm$^{-3}$ (resistivity is approximately and the highly p-doped semiconductor substrate is doped with a dopant concentration of at least $1*10^{18}$ cm$^{-3}$.

More details and aspects are mentioned in connection with the embodiments described above or below. The example shown in FIG. 6 may comprise one or more optional additional features corresponding to one or more aspects mentioned in connection with the proposed concept or one or more examples described above (e.g. FIG. 1-5) or below (e.g. FIG. 7-10).

Figure 7:
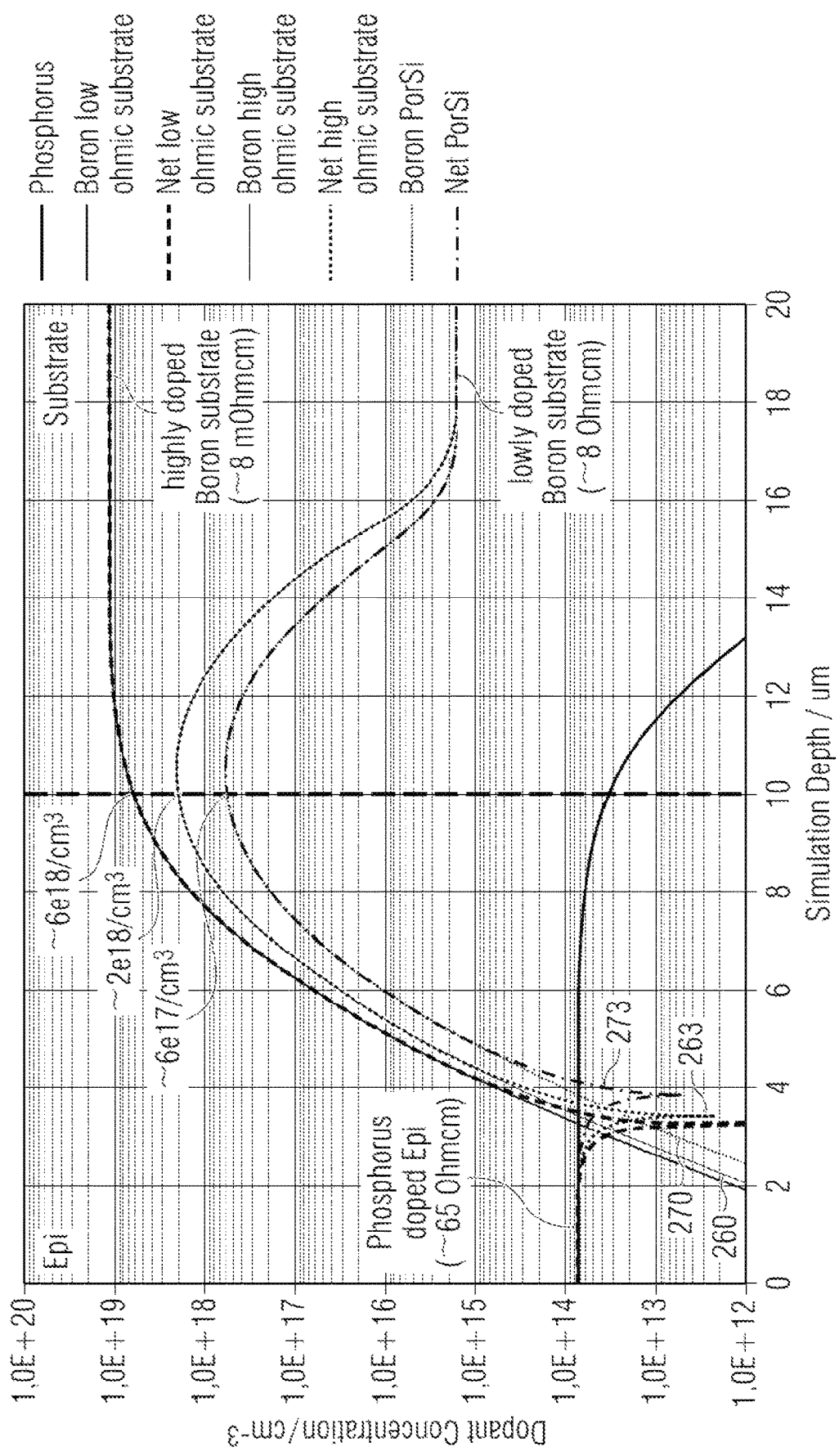
FIG. 7 is a simulated graph that illustrates the processing of FIG. 6 and a decrease of the boron concentration due to the porosity of the first semiconductor layer.

FIG. 7 is a simulated graph of the dopant concentration as a function of the depth, that illustrates the processing of FIG. 6 and furthermore, the increasing of the porosity of the first semiconductor layer. Line 270 shows the acceptor concentration inside the first/second semiconductor layer and the semiconductor substrate for performed increasing the porosity. The dopant concentration at the back side of the second semiconductor layer is beneficial reduced by increasing the porosity from $2*10^{18}$ cm$^{-3}$ before increasing the porosity 260 by about 70%, so that the dopant concentration is roughly $6*10^{17}$ cm$^{-3}$ after increasing the porosity 270. Therefore, an acceptor concentration at the back side of the second semiconductor layer is beneficial reduced by increasing the porosity 270 in comparison to non increasing the porosity 260 and a dopant distribution may be improved. Furthermore, a distance of a p-n-junction formed inside of the second semiconductor layer to the semiconductor substrate is reduced by increasing the porosity 273 in comparison to nonincreasing the porosity 263 and a dopant distribution may be improved.

More details and aspects are mentioned in connection with the embodiments described above or below. The example shown in FIG. 7 may comprise one or more optional additional features corresponding to one or more aspects mentioned in connection with the proposed concept or one or more examples described above (e.g. FIG. 1-6) or below (e.g. FIG. 8-10).

FIG. 8 is a simulated graph of the dopant concentration as a function of the depth, that illustrates the processing of FIG. 7 and furthermore, the annealing of the first semiconductor layer. Line 280 shows the acceptor concentration inside the first/second semiconductor layer and the semiconductor substrate for performed annealing of the first semiconductor layer. The dopant concentration at the back side of the second semiconductor layer is beneficial reduced from $6*10^{17}$ cm$^{-3}$ before annealing 270 by about 90%, so that the dopant concentration is roughly $6*10^{16}$ cm$^{-3}$ after annealing 280. Therefore, an acceptor concentration at the back side of the second semiconductor layer is beneficial reduced by annealing 280 in comparison to non annealing 270 and a dopant distribution may be improved. Furthermore, a distance of a p-n-junction formed inside of the second semiconductor layer to the semiconductor substrate is reduced by annealing 283 in comparison to non annealing 273 and a dopant distribution may be improved.

More details and aspects are mentioned in connection with the embodiments described above or below. The example shown in FIG. 8 may comprise one or more optional additional features corresponding to one or more aspects mentioned in connection with the proposed concept or one or more examples described above (e.g. FIG. 1-7) or below (e.g. FIG. 9a-10).

Figure 9A:
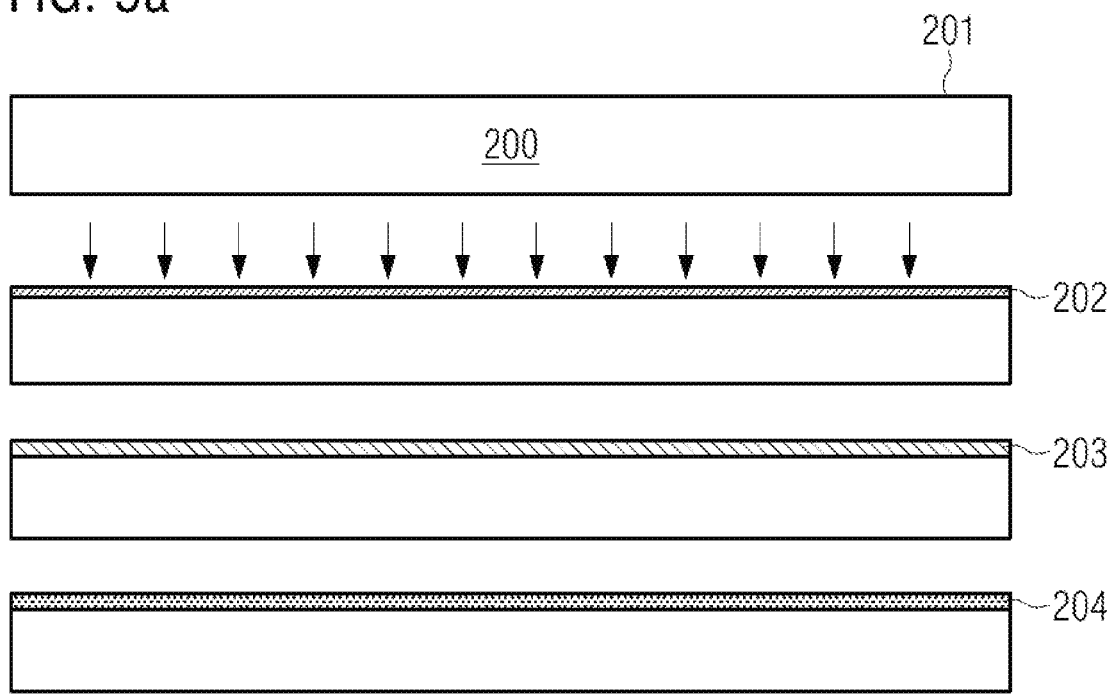
FIGS. 9*a* and 9*b* show schematic views of cross sections of a semiconductor substrate during manufacturing a first semiconductor layer.

FIG. 9a shows a schematic view of a cross section of a semiconductor substrate, which is subject to manufacturing a first semiconductor layer according to an embodiment. On a surface 201 of the lowly p-doped semiconductor substrate 200 a highly p-doped first semiconductor layer 202 is formed by ion implantation. The first semiconductor layer 202 may be formed by a boron implantation into the surface 201 of the semiconductor substrate 200. Furthermore, the first semiconductor 202 layer is formed by a heat treatment 203 for recovery (cure lattice damage caused by ion implantation) and/or activation (activate the implanted dopants) and/or forming the dopant profile by dopant diffusion. A porosification process alters the first semiconductor layer formed by a heat treatment 203 into a porous layer 204, decreasing a dopant concentration of the first semiconductor layer.

More details and aspects are mentioned in connection with the embodiments described above or below. The example shown in FIG. 9a may comprise one or more optional additional features corresponding to one or more aspects mentioned in connection with the proposed concept or one or more examples described above (e.g. FIG. 1-8) or below (e.g. FIG. 9b-10).

Figure 9B:
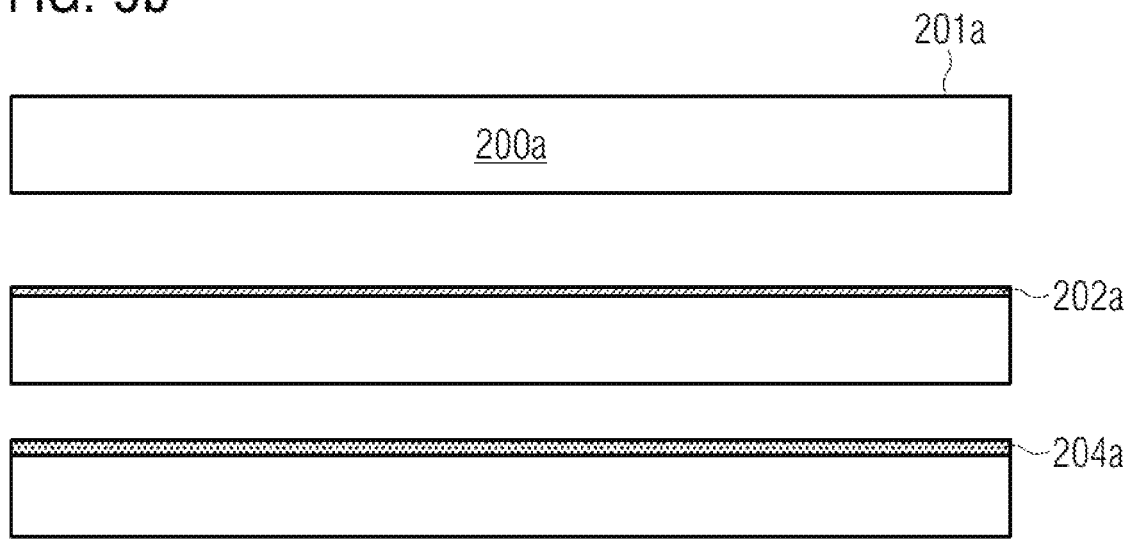

FIG. 9b shows a schematic view of a cross section of a semiconductor substrate, which is subject to manufacturing a first semiconductor layer according to an embodiment. On a surface 201a of the lowly p-doped semiconductor substrate 200a a highly p-doped first semiconductor layer 202a is formed by epitaxial growth. The first semiconductor layer may be formed by p-doped epitaxial growth. A porosification process alters the first semiconductor layer 202a into a porous layer 204a, decreasing a dopant concentration of the first semiconductor layer, More details and aspects are mentioned in connection with the embodiments described above or below. The example shown in FIG. 9b may comprise one or more optional additional features corresponding to one or more aspects mentioned in connection with the proposed concept or one or more examples described above (e.g. FIG. 1-9a) or below (e.g. FIG. 10).

Figure 10:
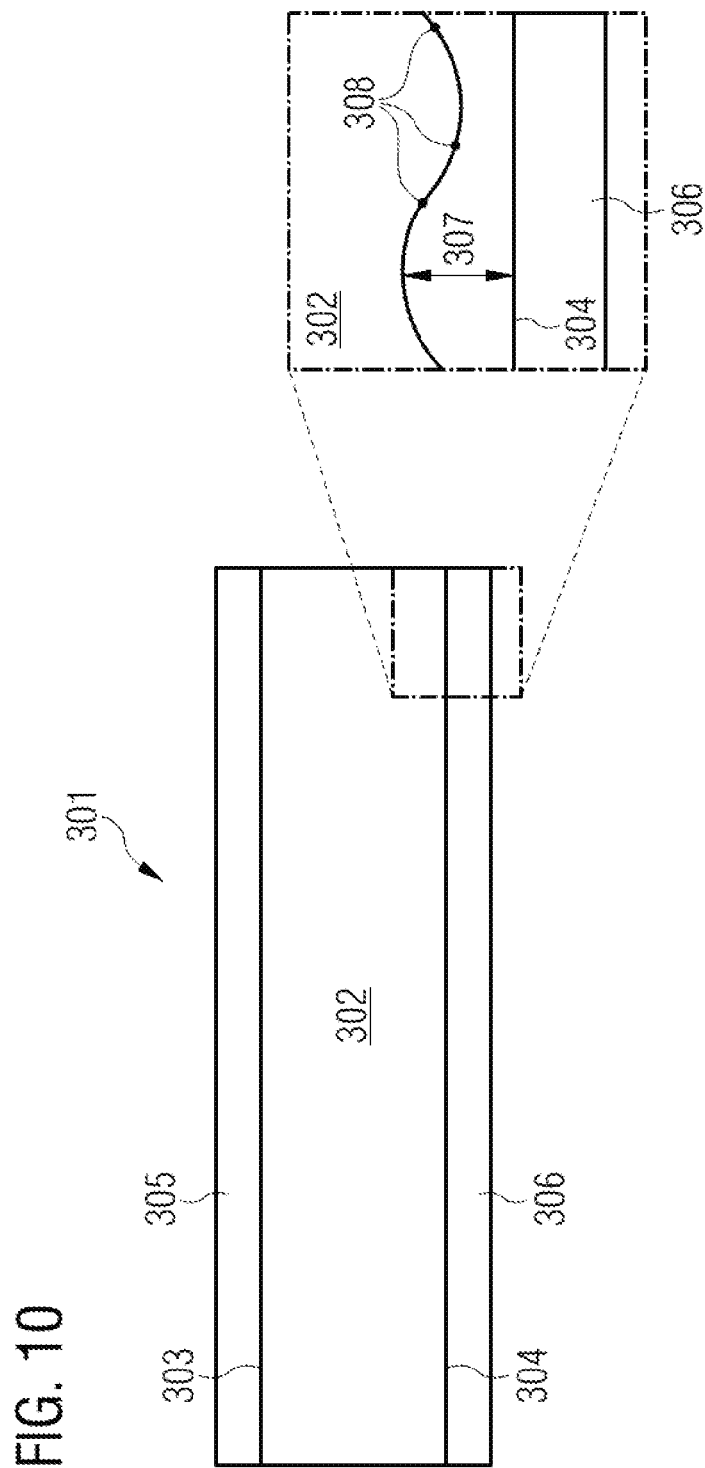
FIG. 10 shows a schematic view of a cross section of a semiconductor device.

FIG. 10 shows a schematic view of a cross section of a semiconductor device according to an embodiment. The semiconductor device comprises a vertical element 301 formed at the second semiconductor layer 302, a front side metallization 305 located on a front side surface 303 of the second semiconductor layer 302 and a back side metallization 306 located on a back side surface 304 of the second semiconductor layer 302. Further the vertical electrical element 301 is configured to conduct current between the front side metallization 305 and the back side metallization 306 in at least one operating state of the vertical electrical element 301. Further a concentration of p-type dopants at the back side surface 304 of the second semiconductor layer 302 is at least $1*10^{14}$ cm$^{-3}$ (or at least $1*10^{15}$ cm$^{-3}$ or at least $1*10^{16}$ cm$^{-3}$) and/or at most $1*10^{18}$ cm$^{-3}$ (or at most $1*10^{15}$ cm$^{-3}$ or at most $1*10^{16}$ cm$^{-3}$).

The semiconductor device may further comprise a vertical electrical element 301 formed at a second semiconductor layer 302, a front side metallization 305 located on a front side surface 303 of the second semiconductor layer 302 and a back side metallization 306 located on a back side surface 304 of the second semiconductor layer 302. Further the vertical electrical element 301 is configured to conduct current between the front side metallization 305 and the back side metallization 306 in at least one operating state of the vertical electrical element 301.

More details and aspects are mentioned in connection with the embodiments described above. The example shown in FIG. 10 may comprise one or more optional additional features corresponding to one or more aspects mentioned in connection with the proposed concept or one or more examples described above (e.g. FIG. 1-9*b*).

Although the present disclosure is not so limited, the following numbered examples demonstrate one or more aspects of the disclosure.

Example 1. A method of forming a semiconductor device, the method comprising: forming a first semiconductor layer on a semiconductor substrate, the first semiconductor layer being of the same dopant type as the semiconductor substrate, the first semiconductor layer having a higher dopant concentration than the semiconductor substrate; increasing the porosity of the first semiconductor layer; first annealing the first semiconductor layer at a temperature of at least 1050° C.; forming a second semiconductor layer on the first semiconductor layer; and separating the second semiconductor layer from the semiconductor substrate by splitting within the first semiconductor layer.

Example 2. A method of forming a semiconductor device, the method comprising: forming a first semiconductor layer on a semiconductor substrate, the first semiconductor layer being of the same dopant type as the semiconductor substrate, the first semiconductor layer having a higher dopant concentration than the semiconductor substrate; increasing the porosity of the first semiconductor layer; first annealing the first semiconductor layer in an atmosphere including at least one material from the group nitrogen and argon; forming a second semiconductor layer on the first semiconductor layer; and separating the second semiconductor layer from the semiconductor substrate by splitting within the first semiconductor layer.

Example 3. A method of forming a semiconductor device, the method comprising: forming a first semiconductor layer on a semiconductor substrate, the first semiconductor layer being of the same dopant type as the semiconductor substrate, the first semiconductor layer having a higher dopant concentration than the semiconductor substrate; increasing the porosity of the first semiconductor layer; decreasing the dopant concentration of the first semiconductor layer so that the dopant concentration of the first semiconductor layer is $16$ cm$^{-3}$ or less; forming a second semiconductor layer on the first semiconductor layer; and separating the second semiconductor layer from the semiconductor substrate by splitting within the first semiconductor layer.

Example 4. A method of forming a semiconductor device, the method comprising: forming a first semiconductor layer on a semiconductor substrate, the first semiconductor layer being of the same dopant type as the semiconductor substrate, the first semiconductor layer having a higher dopant concentration than the semiconductor substrate; increasing the porosity of the first semiconductor layer; decreasing the dopant concentration of the first semiconductor layer by at least 15%; forming a second semiconductor layer on the first semiconductor layer; and separating the second semiconductor layer from the semiconductor substrate by splitting within the first semiconductor layer.

Example 5. The method of any of examples 1 through 4, wherein the first annealing of the first semiconductor layer is done in an atmosphere including at least one material from the group nitrogen and argon.

Example 6. The method of any of examples 1 through 5, further comprising decreasing the dopant concentration of the first semiconductor layer so that the dopant concentration of the first semiconductor layer is $5*10^{16}$ cm$^{-3}$ or less.

Example 7. The method of any of examples 1 through 6, further comprising decreasing the dopant concentration of the first semiconductor layer by at least 15%.

Example 8. The method of any of examples 1 through 7, wherein the first annealing is performed in an atmosphere including argon but lacking nitrogen.

Example 9. The method of any of examples 1 through 8, wherein the first annealing is performed at a temperature of 1300° C. or less.

Example 10. The method of any of examples 1 through 9, further comprising smoothing the surface of the first semiconductor layer before forming the second semiconductor layer.

Example 11. The method of example 10, wherein the smoothing is performed at the same time as or after decreasing the dopant concentration of the first semiconductor layer.

Example 12. The method of any of examples 1 through 11, further comprising a second annealing in an atmosphere of hydrogen, the second annealing performed after the first annealing but before forming the second semiconductor layer.

Example 13. The method of example 12, wherein the second annealing of the first semiconductor layer is performed at a temperature of 1100° C. or less.

Example 14. The method of example 12 or 13, wherein the second annealing is performed at a temperature of at least 800° C.

Example 15. The method of any of examples 1 through 14, wherein forming the first semiconductor layer on the semiconductor substrate comprises: providing a semiconductor substrate; and doping an upper portion of the semiconductor substrate.

Example 16. The method of any of examples 1 through 15, wherein decreasing the dopant concentration includes causing the first semiconductor layer to out diffuse the dopants.

Example 17. The method of any of examples 1 through 16, wherein the second semiconductor layer is an epitaxial layer.

Example 18. The method of any of examples 1 through 17, wherein the dopant type is p-type.

Example 19. The method of any of examples 1 through 18, further comprising forming an electrical element of the semiconductor device on the second semiconductor layer before separating the second semiconductor layer from the semiconductor substrate.

Example 20. The method of any of examples 1 through 19, wherein the semiconductor device to be formed comprises a breakdown voltage of at least 50V.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method of forming a semiconductor device, the method comprising:
   forming a first semiconductor layer on a semiconductor substrate, the first semiconductor layer being of the same dopant type as the semiconductor substrate, the first semiconductor layer having a higher dopant concentration than the semiconductor substrate;
   increasing the porosity of the first semiconductor layer;
   first annealing the first semiconductor layer in an atmosphere including an inert gas;
   smoothing a surface of the first semiconductor layer in an ambient atmosphere of hydrogen;
   forming a second semiconductor layer on the smoothed surface of the first semiconductor layer; and
   separating the second semiconductor layer from the semiconductor substrate by splitting within the first semiconductor layer,
   wherein the smoothing comprises pore reorganization of the first semiconductor layer.

2. The method of claim 1, wherein the first annealing is performed before the forming of the second semiconductor layer.

3. The method of claim 1, wherein the inert gas comprises nitrogen and/or argon.

4. The method of claim 1, wherein the inert gas comprises argon but lacks nitrogen.

5. The method of claim 1, further comprising:
   oxidizing at least a part of surfaces of pores of the first semiconductor layer.

6. The method of claim 5, wherein the oxidizing comprises electrochemical anodic oxidation.

7. The method of claim 5, further comprising:
   after the oxidizing, etching and/or polishing the surface of the first semiconductor layer on which the second semiconductor layer is to be formed.

8. The method of claim 1, further comprising:
   a second annealing in an atmosphere of hydrogen, wherein the second annealing is performed after the first annealing but before forming the second semiconductor layer.

9. The method of claim 1, further comprising:
   before forming the second semiconductor layer, reducing a total amount of void space accessible from the surface of the first semiconductor layer on which the second semiconductor layer is to be formed.

10. The method of claim 9, wherein the reducing the total amount of void space comprises:
    subjecting the surface of the first semiconductor layer to the ambient atmosphere of hydrogen at a temperature of at least 1050° C. for at least 15 minutes.

11. A method of forming a semiconductor device, the method comprising:
    forming a first semiconductor layer on a semiconductor substrate, the first semiconductor layer being of the same dopant type as the semiconductor substrate, the first semiconductor layer having a higher dopant concentration than the semiconductor substrate;
    increasing the porosity of the first semiconductor layer;
    decreasing the dopant concentration of the first semiconductor layer so that the dopant concentration of the first semiconductor layer is $5*10^{16}$ cm$^3$ or less;
    smoothing a surface of the first semiconductor layer in an ambient atmosphere of hydrogen;
    forming a second semiconductor layer on the smoothed surface of the first semiconductor layer; and
    separating the second semiconductor layer from the semiconductor substrate by splitting within the first semiconductor layer,
    wherein the smoothing comprises pore reorganization of the first semiconductor layer,
    wherein the smoothing of the surface of the first semiconductor layer is performed after the decreasing of the dopant concentration of the first semiconductor layer.

12. The method of claim 11, wherein the decreasing of the dopant concentration of the first semiconductor layer comprises heating the first semiconductor layer.

13. The method of claim 12, wherein the heating comprises annealing the first semiconductor layer at a temperature in a range of least 1050° C. to 1400° C.

14. The method of claim 13, wherein the annealing is performed for at least 60 minutes and at most 300 minutes.

15. The method of claim 11, wherein the smoothing of the surface of the first semiconductor layer is performed at the same time as the decreasing of the dopant concentration of the first semiconductor layer.

16. A method of forming a semiconductor device, the method comprising:

forming a first semiconductor layer on a semiconductor substrate, the first semiconductor layer being of the same dopant type as the semiconductor substrate, the first semiconductor layer having a higher dopant concentration than the semiconductor substrate;

increasing the porosity of the first semiconductor layer;

decreasing the dopant concentration of the first semiconductor layer by at least 15%;

smoothing a surface of the first semiconductor layer in an ambient atmosphere of hydrogen;

forming a second semiconductor layer on the smoothed surface of the first semiconductor layer; and separating the second semiconductor layer from the semiconductor substrate by splitting within the first semiconductor layer, wherein the smoothing comprises pore reorganization of the first semiconductor layer, wherein the smoothing of the surface of the first semiconductor layer is performed after the decreasing of the dopant concentration of the first semiconductor layer.

17. The method of claim 16, wherein the decreasing of the dopant concentration of the first semiconductor layer comprises heating the first semiconductor layer.

18. The method of claim 17, wherein the heating comprises annealing the first semiconductor layer at a temperature in a range of least 1050° C. to 1400° C.

19. The method of claim 18, wherein the annealing is performed for at least 60 minutes and at most 300 minutes.

* * * * *

UNITED STATES PATENT AND TRADEMARK OFFICE
CERTIFICATE OF CORRECTION

PATENT NO. : 12,211,703 B2  
APPLICATION NO. : 18/236434  
DATED : January 28, 2025  
INVENTOR(S) : H. Schulze et al.

Page 1 of 1

It is certified that error appears in the above-identified patent and that said Letters Patent is hereby corrected as shown below:

In the Claims

Column 18, Line 55 (Claim 11, Line 11) please change "$cm^3$" to -- $cm^{-3}$ --

Signed and Sealed this  
First Day of April, 2025

Coke Morgan Stewart  
*Acting Director of the United States Patent and Trademark Office*